United States Patent
Lear et al.

(10) Patent No.: US 12,500,567 B2
(45) Date of Patent: Dec. 16, 2025

(54) ACOUSTIC FILTERS WITH IMPROVED RETURN LOSS

(71) Applicant: Qorvo US, Inc., Greensboro, NC (US)

(72) Inventors: Kelly M. Lear, Longwood, FL (US); Nikolaus Klemmer, Dallas, TX (US); Jeffery Galipeau, Apopka, FL (US); Chris Levesque, Fountain Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 162 days.

(21) Appl. No.: 18/387,679

(22) Filed: Nov. 7, 2023

(65) Prior Publication Data

US 2024/0195381 A1 Jun. 13, 2024

Related U.S. Application Data

(60) Provisional application No. 63/430,912, filed on Dec. 7, 2022.

(51) Int. Cl.
*H03H 9/02* (2006.01)
*H03H 9/54* (2006.01)
*H03H 9/60* (2006.01)

(52) U.S. Cl.
CPC .......... *H03H 9/0211* (2013.01); *H03H 9/542* (2013.01); *H03H 9/605* (2013.01)

(58) Field of Classification Search
CPC .... H03H 7/075; H03H 7/1758; H03H 7/0115; H03H 7/0161; H03H 7/175; H03H 7/1766; H03H 7/1775; H03H 7/463; H03H 7/461; H03H 7/06; H03H 7/1783; H03H 7/1791; H03H 7/38; H03H 7/0153; H03H 7/12; H03H 7/20; H03H 7/40; H03H 7/54; H03H 7/01; H03H 7/03; H03H 7/18; H03H 7/383; H03H 7/46; H03H 9/0211; H03H 9/542;

(Continued)

(56) References Cited

U.S. PATENT DOCUMENTS 6,567,519 B1 * 5/2003 Ham ..................... H03H 7/46
379/372
9,165,101 B2 10/2015 Turner et al.
(Continued)

FOREIGN PATENT DOCUMENTS

EP 4084332 A1 11/2022

OTHER PUBLICATIONS

Gomez-Garcia, R. et al., "Avoiding RF Isolators: Reflectionless Microwave Bandpass Filtering Components for Advanced RF Front Ends," IEEE Microwave Magazine, vol. 21, Issue 12, Dec. 2020, IEEE, pp. 68-86.

(Continued)

*Primary Examiner* — John W Poos
(74) *Attorney, Agent, or Firm* — Withrow & Terranova, P.L.L.C.

(57) ABSTRACT

Embodiments of an acoustic filter are disclosed. In some embodiments, a bandpass filter is included in a passband signal path, the passband signal path is connected between a first terminal and a second terminal. A first bandstop filter is located in a first stopband signal path, the first stopband signal path connected at the first terminal. Additionally, a second bandstop filter is located in a second stopband signal path, the second stopband signal path is connected at the second terminal.

25 Claims, 11 Drawing Sheets

(58) Field of Classification Search
CPC ...... H03H 9/605; H03H 9/568; H03H 9/6483; H03H 9/547
See application file for complete search history.

(56) References Cited

U.S. PATENT DOCUMENTS

| | | | |
|---|---|---|---|
| 9,979,379 B2 | 5/2018 | Yasuda et al. | |
| 9,985,682 B2* | 5/2018 | Khlat | H04B 1/50 |
| 10,097,153 B1* | 10/2018 | Rowland | H03H 7/0115 |
| 11,043,934 B2 | 6/2021 | Mori | |
| 2009/0128260 A1* | 5/2009 | Block | H03H 9/568 |
| | | | 333/187 |

OTHER PUBLICATIONS

Morgan, M. et al., "Reflectionless Filter Structures," IEEE Transactions on Microwave Theory and Techniques, vol. 63, No. 4, Apr. 2015, first published Feb. 2015, IEEE, 9 pages.

Morgan, M. et al., "Theoretical and Experimental Study of a New Class of Reflectionless Filter," IEEE Transactions on Microwave Theory and Techniques, vol. 59, No. 5, May 2011, IEEE, pp. 1214-1221.

Pratt, P. et al., "Ultrawideband Digital Predistortion (DPD): The Rewards (Power and Performance) and Challenges of Implementation in Cable Distribution Systems," Analog Dialogue 51-07, Jul. 2017, available from the Internet: [URL: https://www.analog.com/en/analog-dialogue/articles/ultrawideband-digital-predistortion-rewards-and-challenge-of-implementation-in-cable-system.html], 7 pages.

Psychogiou, D. et al., "Input-Reflectionless Acoustic-Wave-Lumped-Element Resonator-Based Bandpass Filters," 2018 IEEE/MTT-S International Microwave Symposium, Jun. 10-15, 2018, Philadelphia, PA, IEEE, 4 pages.

Verdu, J. et al., "Reflectionless High-Selective Bandpass Filter Based on Acoustic Wave Resonators," Progress In Electromagnetics Research Letters, vol. 80, 2018, pp. 15-22.

Lin, W. et al., "Symmetrical Quasi-Absorptive Filter Based on SAW Resonators and Lumped Elements," 2022 IEEE MTT-S International Microwave Workshop Series on Advanced Materials and Processes for RF and THz Applications (IMWS-AMP), Nov. 27-29, 2022, Guangzhou, China, IEEE, 2 pages.

Psychogiou, D. et al., "Symmetrical Quasi-Reflectionless SAW-Based Bandpass Filters With Tunable Bandwidth," IEEE Microwave and Wireless Components Letters, vol. 29, Issue 7, Jul. 2019, first published Jun. 2019, IEEE, pp. 447-449.

Extended European Search Report for European Patent Application No. 23215029.2, mailed May 14, 2024, 16 pages.

* cited by examiner

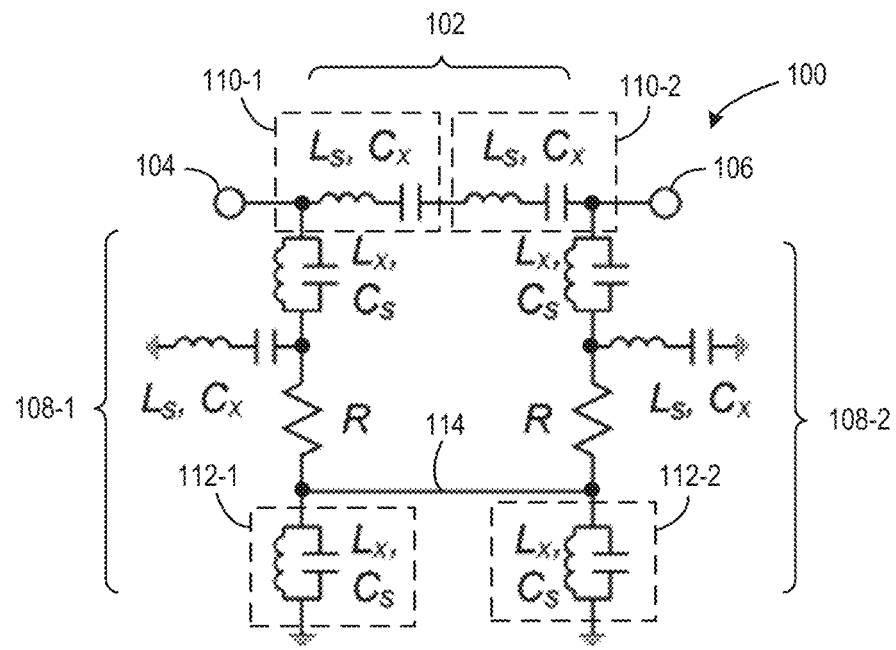
FIG. 1 – Prior Art
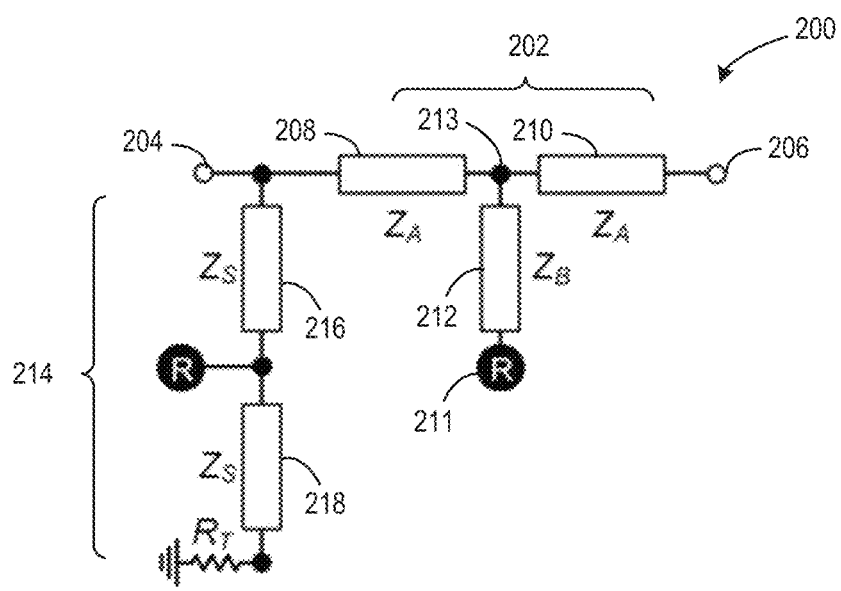
FIG. 2 – Prior Art

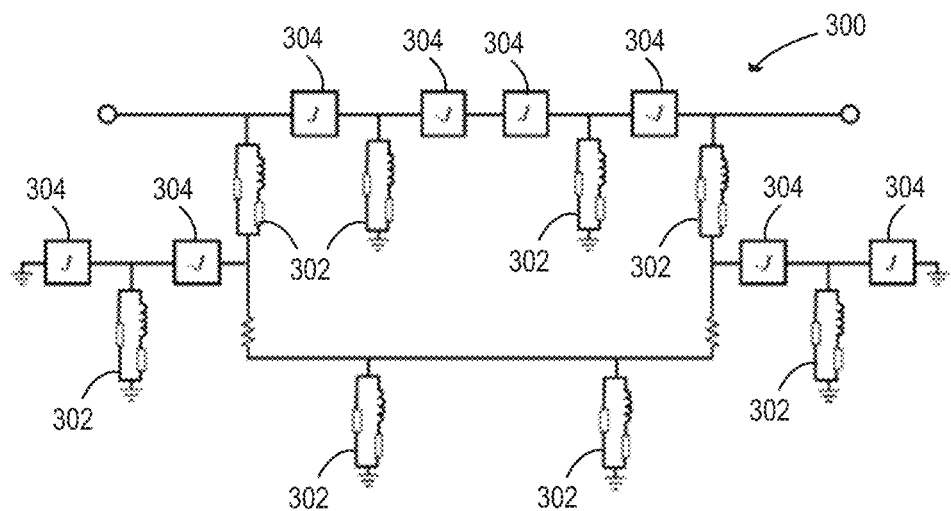
FIG. 3 – Prior Art
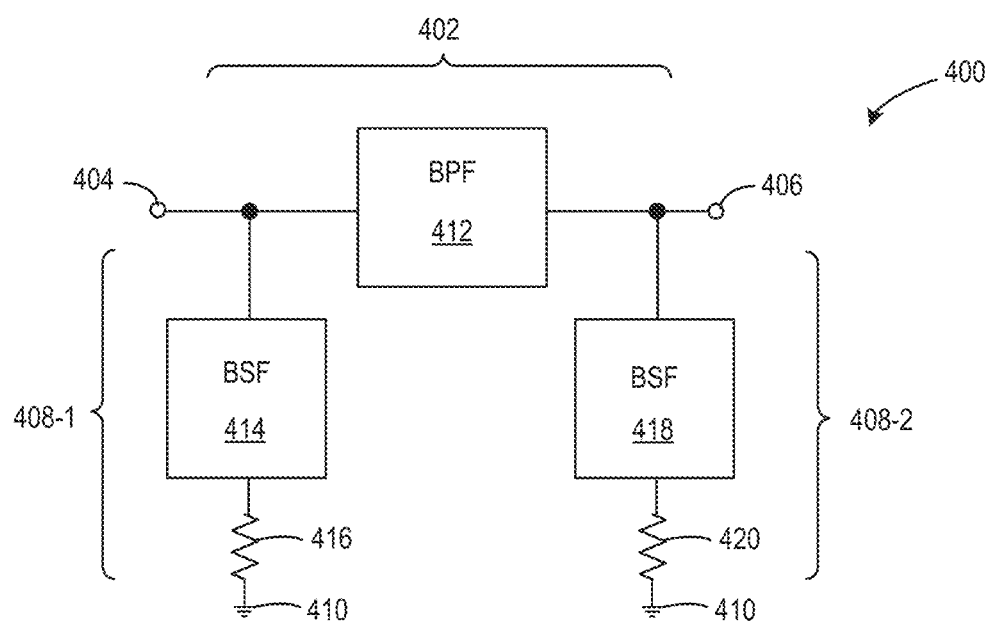
FIG. 4

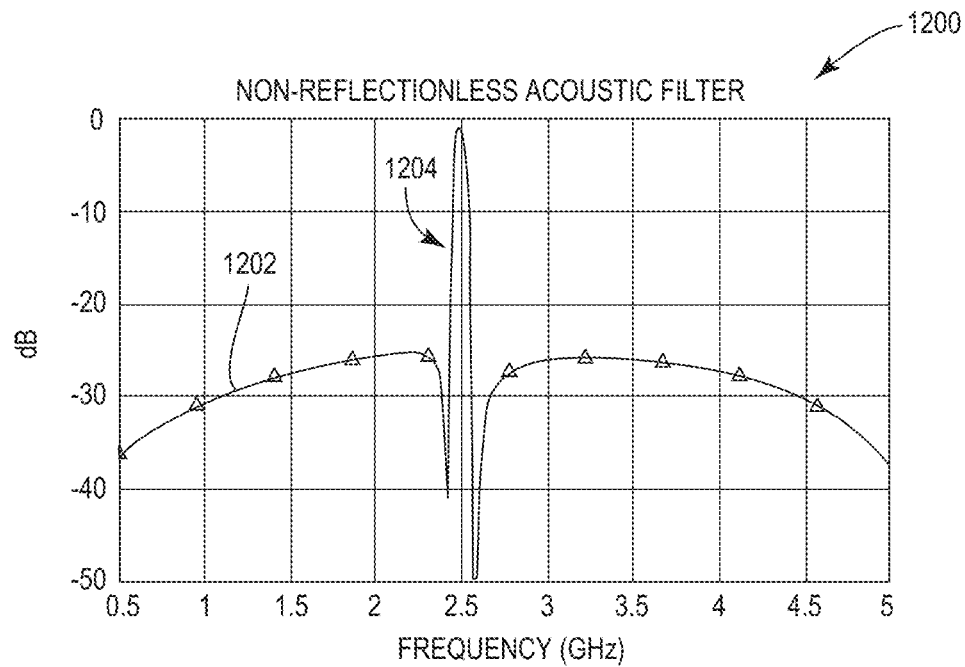
FIG. 12 – RELATED ART
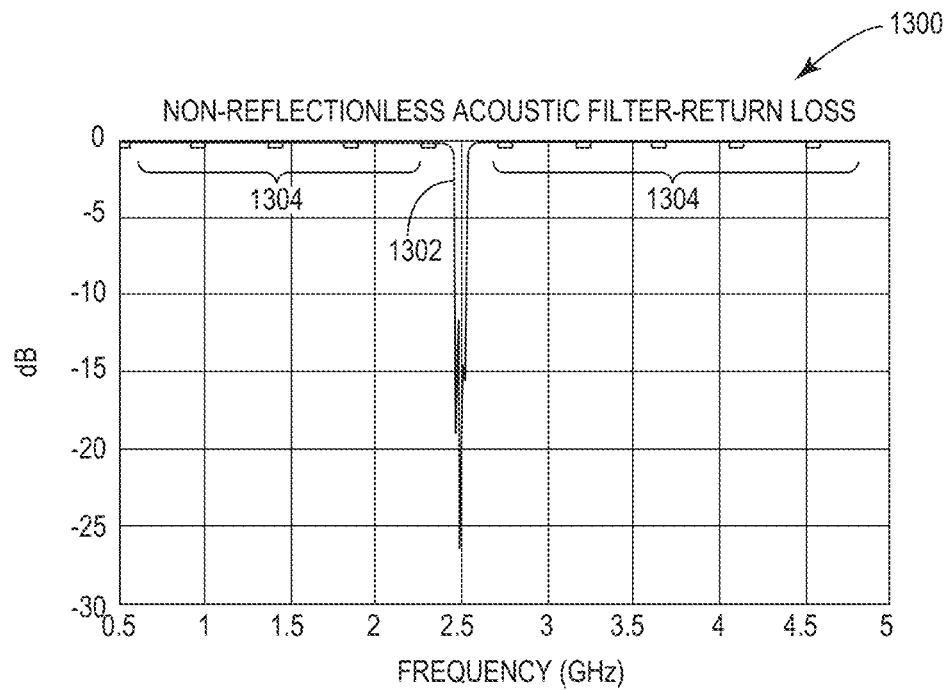
FIG. 13 – RELATED ART

ACOUSTIC FILTERS WITH IMPROVED RETURN LOSS

RELATED APPLICATIONS

This application claims the benefit of provisional patent application Ser. No. 63/430,912, filed Dec. 7, 2022, the disclosure of which is hereby incorporated herein by reference in its entirety.

FIELD OF THE DISCLOSURE

The present disclosure relates generally to acoustic filters. Still more particularly, the present disclosure relates to acoustic filters with reduced reflections and improved return loss.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates a schematic of a first filter in accordance with the prior art;

FIG. 2 illustrates a schematic of a second filter in accordance with the prior art;

FIG. 3 illustrates a schematic of a third filter in accordance with the prior art;

FIG. 4 illustrates a schematic of a reflectionless acoustic filter in accordance with embodiments of the disclosure;

FIG. 12 illustrates a graph that includes an example plot of a filter response for a non-reflectionless bulk acoustic wave (BAW) filter in accordance with related art;

FIG. 13 illustrates a graph that includes an example plot of a return loss for the non-reflectionless BAW filter that is associated with the filter response shown in FIG. 12 in accordance with related art;

DESCRIPTION

Figure 5:
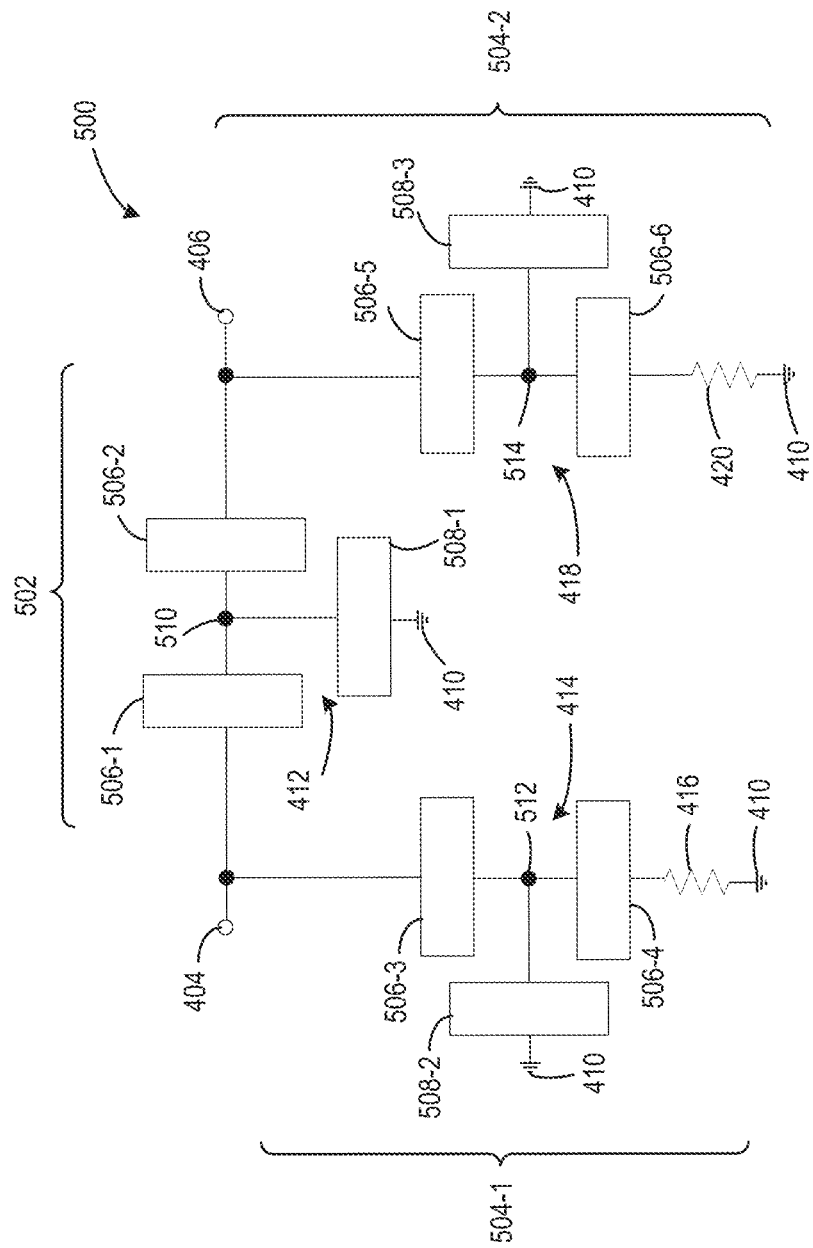
FIG. 5 illustrates a schematic of an example first implementation of the reflectionless acoustic filter shown in FIG. 4 in accordance with embodiments of the disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Traditional bandpass filters, highpass filters, and lowpass filters can have high or very high reflection coefficients in their stopbands. Reflectionless acoustic filters based on a coupling matrix have been proposed, however, the acoustic filters require quarter wavelength lines or inductor-capacitor (LC) equivalent circuits of the quarter wavelengths lines, which is not desirable due to size and loss. The reflectionless acoustic filters also typically require an inductor at each acoustic resonator to resonate out the static capacitance, which can dramatically degrade the steepness of the transition regions of the passband.

FIG. 1 illustrates a schematic of a first filter 100 in accordance with the prior art. The first filter 100 is proposed in a paper entitled "Theoretical and Experimental Study of a New Class of Reflectionless Filters" by M. A. Morgan and T. A. Boyd (IEEE Transactions on Microwave Theory and Techniques, Vol. 59, No. 5 (May 2011)). The first filter 100 is a bandpass filter that is constructed with resistors, capacitors, and inductors.

The first filter 100 includes a passband signal path 102 that is connected between a first terminal 104 and a second terminal 106. A first stopband signal path 108-1 is connected between the first terminal 104 and ground. A second stopband signal path 108-2 is connected between the second terminal 106 and ground.

The passband signal path 102 includes a first resonator 110-1 and a second resonator 110-2 connected in series. Because the first filter 100 is constructed with resistors, inductors, and capacitors, the size of the first filter 100 can be large. In some instances, the first resonator 110-1 and the second resonator 110-2 do not maximize the steepness of the passband, where the steepness controls a width of the transition regions of the passband. Additionally or alternatively, the first resonator 110-1 and the second resonator 110-2 may not minimize loss in the first filter 100.

A cross path 114 is connected between a first inductor-capacitor circuit 112-1 in the first stopband signal path 108-1 and a second inductor-capacitor circuit 112-2 in the second stopband signal path 108-2. However, in implementations that involve higher frequencies, it may not be desirable to include the first inductor-capacitor circuit 112-1-to-ground and the second inductor-capacitor circuit 112-2-to-ground. Additionally, the cross path 114 may have a significant electrical length at higher frequencies.

FIG. 2 illustrates a schematic of a second filter 200 in accordance with the prior art. The second filter 200 is proposed in a paper entitled "Input-Reflectionless Acoustic-Wave-Lumped-Element Resonator-Based Bandpass Filters" by D. Psychogiou, D. J. Simpson, and R. Gómez-Garcia (IEEE/MTT-S International Microwave Symposium—IMS, pp. 852-855 (2018)). The second filter 200 is a bandpass filter that is constructed with acoustic-wave-lumped-element (AWLR) resonators (R in the circles in FIG. 2) and impedance inverters.

The second filter 200 includes a passband signal path 202 that is connected between an input terminal 204 and an output terminal 206. The passband signal path 202 includes a first impedance inverter 208 and a second impedance inverter 210 connected in series. A third impedance inverter 212 is connected between an AWLR resonator 211 and a node 213 that is between the first impedance inverter 208 and the second impedance inverter 210.

A stopband signal path 214 is connected between the input terminal 204 and ground. The stopband signal path 214 includes a fourth impedance inverter 216 and a fifth impedance inverter 218 connected in series, and a termination resistor 220 connected between the fifth impedance inverter 218 and ground. The first impedance inverter 208, the second impedance inverter 210, the third impedance inverter 212, the fourth impedance inverter 216, and the fifth impedance inverter 218 may be implemented as quarter wavelength lines, which are large. Alternatively, the first impedance inverter 208, the second impedance inverter 210, the third impedance inverter 212, the fourth impedance inverter 216, and the fifth impedance inverter 218 can be implemented as inductor-capacitor (LC) equivalent circuits, which are lossy. Additionally, the transition regions of the passband are not very steep.

FIG. 3 illustrates a schematic of a third filter 300 in accordance with the prior art. The third filter 300 is proposed in a paper entitled "Reflectionless High-Selective Bandpass Filter Based on Acoustic Wave Resonators" by J. Verdú, D. Ulinic, and P. de Paco (Progress in Electromagnetics Research Letters, Vol. 80 (2018)). The third filter 300 is a bandpass filter that is constructed with acoustic wave resonators 302 and admittance inverters 304. Like the second filter 200 shown in FIG. 2, the admittance inverters 304 may be implemented as quarter wavelength lines, which are large. Since there are a total of eight (8) quarter wavelength lines in FIG. 3, two (2) wavelengths of transmission line are used in each section (e.g., in the bandpass filter section and/or in the bandstop filter sections), which are usually large and may limit the type of devices that can use the third filter 300. If the admittance inverters are implemented as inductor-capacitor (LC) equivalent circuits, the LC equivalent circuits are lossy.

Embodiments disclosed herein provide acoustic filter structures that have reduced reflections and improved return loss across a frequency range. In certain embodiments, the acoustic filter structures experience greatly reduced reflections or minimal reflections. Such filter structures are referred to herein as "reflectionless acoustic filters." The disclosed reflectionless acoustic filters do not require quarter wavelength lines or the LC equivalent circuits, and do not require inductors to resonate out static capacitance. With respect to FIG. 1, the disclosed reflectionless acoustic filters do not use the cross path 114, and do not include the first inductor-capacitor circuit 112-1 and second inductor-capacitor circuit 112-2.

The reflectionless acoustic filters may include bulk acoustic wave (BAW) resonators, surface acoustic wave (SAW) resonators, or combinations of BAW resonators and SAW resonators. The reflectionless acoustic wave filters allow for a more typical BAW filter or SAW filter to be included on a die, which preserves the size and the steepness of the transition regions of the passband. The reflectionless acoustic filters may also have reduced insertion loss than prior filter structures. The reflectionless acoustic filters can also be smaller in size, have less return loss, and low Q values. Since the reflectionless acoustic filters are constructed with acoustic resonators (as well as associated matching components in certain embodiments), the reflectionless acoustic filters may not have low reflection down to direct current (DC) and up to the harmonic frequencies, which can be preferred in some instances.

FIG. 4 illustrates a schematic of a reflectionless acoustic filter 400 in accordance with embodiments of the disclosure. The reflectionless acoustic filter 400 includes a passband signal path 402 connected between a first terminal 404 and a second terminal 406, a first stopband signal path 408-1 connected between the first terminal 404 and a reference terminal 410 (e.g., ground), and a second stopband signal path 408-2 connected between the second terminal 406 and the reference terminal 410. In an example embodiment, the first terminal 404 is an input terminal and the second terminal 406 is an output terminal.

The passband signal path 402 includes a bandpass filter (BPF) 412 connected between the input terminal 404 and the output terminal 406. As will be described in more detail later, the BPF 412 is implemented with one or more acoustic resonators connected in series ("series resonator") between the first terminal 404 and the second terminal 406, and one or more acoustic resonators connected in shunt ("shunt resonator") to the one or more series resonators. Each series resonator and each shunt resonator may be implemented with any type of acoustic resonator, including a BAW resonator or a SAW resonator.

The first stopband signal path 408-1 includes a first bandstop filter (BSF) 414 connected at the first terminal 404 and a first termination resistor 416 connected between the first BSF 414 and the reference terminal 410. The second stopband signal path 408-2 includes a second bandstop filter (BSF) 418 connected at the second terminal 406 and a second termination resistor 420 connected between the second BSF 418 and the reference terminal 410. As will be described in more detail later, the first BSF 414 and the second BSF 418 are each implemented with one or more series resonators connected to one or more shunt resonators to the one or more series resonators. Each series resonator and each shunt resonator may be implemented with any type of acoustic resonator, including a BAW resonator or a surface acoustic wave (SAW) resonator.

The reflectionless acoustic filter 400 has an improved return loss compared to prior art acoustic filters, including the first filter shown in FIG. 1, the second filter shown in FIG. 2, and the third filter shown in FIG. 4. The return loss of the reflectionless acoustic filter 400 can be tuned to have any shape across a range of frequencies. The BPF 412 may be tuned to have a particular passband response, and each of the first BSF 414 and the second BSF 418 can be tuned to have particular stopband responses. The stopband responses can be the same or the stopband response of the first BSF 414 may differ from the stopband response of the second BSF 418.

FIG. 5 illustrates a schematic of an example first implementation 500 of the reflectionless acoustic filter 400 shown in FIG. 4 in accordance with embodiments of the disclosure. The first implementation 500 includes the BPF 412, the first BSF 414, and the second BSF 418. The BPF 412 is included in a passband signal path 502. The passband signal path 502 is connected between the first terminal 410 and a second terminal 412.

The first BSF 414 is part of a first stopband signal path 504-1 that is connected between the first terminal 404 and the reference terminal 410 (e.g., ground). The second BSF 418 is part of a second stopband signal path 504-2 that is connected between the second terminal 406 and the reference terminal 410.

In the illustrated embodiment, the BPF 412 includes a first BAW resonator 506-1 and a second BAW resonator 506-2 (a first "series resonator" 506-1 and a second "series resonator" 506-2) connected in series between the first terminal 404 and the second terminal 406. A third BAW resonator 508-1 (a first "shunt resonator" 508-1) is connected in shunt between the reference terminal 410 and a node 510 that is between the first series resonator 506-1 and the second series resonator 506-2. Although FIG. 4 is described in conjunction with BAW resonators, other embodiments can use SAW resonators.

The first stopband signal path 504-1 includes a third series resonator 506-3 connected at the first terminal 404. A fourth series resonator 506-4 is connected in series with the third series resonator 506-3. A second shunt resonator 508-2 is connected between the reference terminal 410 and a node 512 that is between the third series resonator 506-3 and the fourth series resonator 506-4. The first termination resistor 416 is connected between the fourth series resonator 506-4 and the reference terminal 410.

The second stopband signal path 504-2 includes a fifth series resonator 506-5 connected at the second terminal 406. A sixth series resonator 506-6 is connected in series with the fifth series resonator 506-5. A third shunt resonator 508-3 is connected between the reference terminal 410 and a node 514 that is between the fifth series resonator 506-5 and the sixth series resonator 506-6. The second termination resistor 420 is connected between the sixth series resonator 506-6 and the reference terminal 410.

In some embodiments, the first stopband signal path 504-1 and the second stopband signal path 504-2 are constructed similar to the passband signal path 502, but with the frequencies of the series resonators swapped with the frequencies of the shunt resonators. Thus, the frequencies of the first series resonator 506-1 and the second series resonator 506-2 are used for the frequencies of the second shunt resonator 508-2 and the third shunt resonator 508-3. Similarly, the frequency of the first shunt resonator 508-1 is used for the frequencies of the third series resonator 506-3, the fourth series resonator 506-4, the fifth series resonator 506-5, and the sixth series resonator 506-6. In other embodiments, the construction of the first stopband signal path 504-1 and the second stopband signal path 504-2 differ from the construction of the passband signal path 502. The construction of the first stopband signal path 504-1 may be the same or may differ from the construction of the second stopband signal path 504-2.

Figure 6:
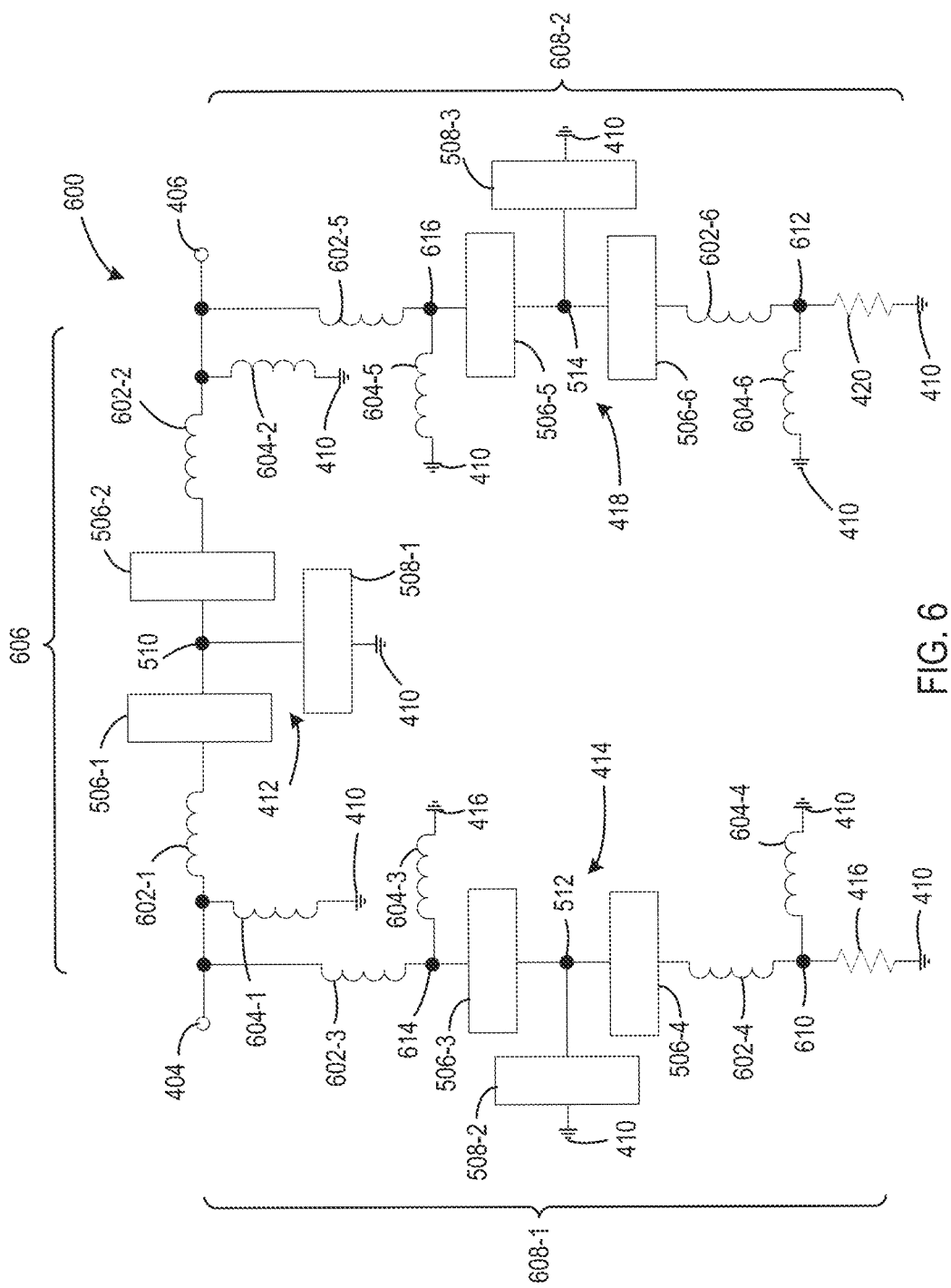
FIG. 6 illustrates a schematic of an example second implementation of the reflectionless acoustic filter shown in FIG. 4 with impedance matching components in accordance with embodiments of the disclosure.

In certain embodiments, a reflectionless acoustic filter includes one or more impedance matching components. FIG. 6 illustrates a schematic of an example second implementation 600 of the reflectionless acoustic filter 400 shown in FIG. 4 with impedance matching components in accordance with embodiments of the disclosure. In the illustrated embodiment, the impedance matching components are shown as inductors. The inductors connected in series are referred to herein as "series inductors" and the inductors connected in shunt are referred to as "shunt inductors."

Other embodiments are not limited to the use of inductors as impedance matching components. The impedance matching components can be one or more of transformers, resistors, capacitors, inductors, transmission lines, or combinations thereof.

In FIG. 6, multiple series inductors 602 are included in a passband signal path 606, in a first stopband signal path 608-1, and in a second stopband signal path 608-2. For example, a first series inductor 602-1 is connected between the first terminal 404 and the BPF 412, and a second series inductor 602-2 is connected between the BPF 412 and the second terminal 406. In the first stopband signal path 608-1, a third series inductor 602-3 is connected between the first terminal 404 and the first BSF 414, and a fourth series inductor 602-4 is connected between the first BSF 414 and a node 610 positioned between the fourth series inductor 602-4 and the first termination resistor 416. In the second stopband signal path 608-2, a fifth series inductor 602-5 is connected between the second terminal 406 and the second BSF 418, and a sixth series inductor 602-6 is connected between the second BSF 418 and a node 612 positioned between the sixth series inductor 602-6 and the second termination resistor 420.

Multiple shunt inductors 604 are included in the passband signal path 606, in the first stopband signal path 608-1, and in the second stopband signal path 608-2. For example, a first shunt inductor 604-1 is connected between the first terminal 404 and the reference terminal 410, and a second shunt inductor 604-2 is connected between the second terminal 406 and the reference terminal 410. In the first stopband signal path 608-1, a third shunt inductor 604-3 is connected between the reference terminal 410 and a node 614 between the first BSF 414 and the third series inductor 602-3, and a fourth shunt inductor 604-4 is connected between the reference terminal 410 and the node 610. In the second stopband signal path 608-2, a fifth shunt inductor 604-5 is connected between the reference terminal 410 and a node 616 between the second BSF 418 and the fifth series inductor 602-5, and a sixth shunt inductor 604-6 is connected between the reference terminal 410 and the node 612.

In other embodiments, some of the series inductors 602 and/or the shunt inductors 604 may be omitted or combined.

For example, the second series inductor 602-2 in the passband signal path 606 and the fifth series inductor 602-5 in the second stopband signal path 608-2 may be combined into one inductor connected to the second terminal 406.

The first termination resistor 416 and the second termination resistor 420 can be omitted in certain embodiments to reduce the size and/or the cost of a reflectionless acoustic filter. Omitting the termination resistor 416 and the termination resistor 420 may increase the return loss at the frequencies near the stopband frequency. The increased return loss at the frequencies near the stopband frequency is a tradeoff for increased rejection at the base of the transition regions of the passband (e.g., see areas 1704 in FIG. 17). This increased rejection at the base of the transition regions may be desirable in certain implementations. The omission of the first termination resistor 416 and the second termination resistor 420 can produce a narrow passband with wider nulls near the passband (e.g., see dashed circles 1604 in FIG. 16) at the expense of return loss just outside of the passband (e.g., see areas 1706 in FIG. 17).

The BPF 412, the first BSF 414, and the second BSF 418 may be configured differently from the BPF 412, the first BSF 414, and the second BSF 418 shown in FIG. 5 and FIG. 6. Generally, the BPF 412, the first BSF 414, and the second BSF 418 each include at least one series resonator 506 and at least one shunt resonator 508 connected to each other in a signal path.

Figure 7:
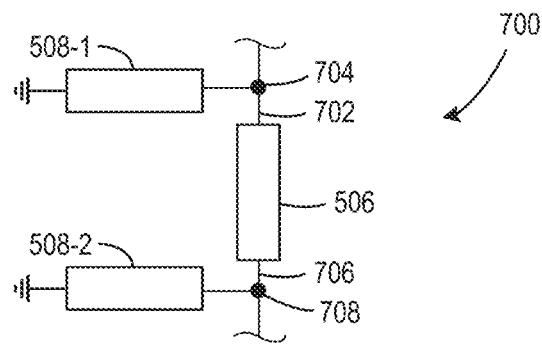
FIG. 7 illustrates a first alternate implementation for each of the passband signal paths and the stopband signal paths shown in FIG. 4-FIG. 6 in accordance with embodiments of the disclosure.

FIG. 7 illustrates a first alternate implementation 700 for each of the passband signal paths and the stopband signal paths shown in FIG. 4-FIG. 6 in accordance with embodiments of the disclosure. The first alternate implementation 700 may be used in the bandpass filter 412 in the passband signal path 402 of FIG. 4. Additionally or alternatively, the first alternate implementation 700 can be used in the first bandstop filter 414 in the first stopband signal path 408-1 and/or in the first bandstop filter 418 in the second stopband signal path 408-2 of FIG. 4. The first alternate implementation 700 may be used in the passband signal path 502 of FIG. 5 and/or in the passband signal path 606 in FIG. 6. Additionally or alternatively, the first alternate implementation 700 can be used in the first stopband signal path 504-1 and/or in the second stopband signal path 504-2 in FIG. 5 and/or in the first stopband signal path 608-1 and/or in the second stopband signal path 608-2 in FIG. 6.

The first alternate implementation 700 includes, at a minimum, a series resonator 506, a first shunt resonator 508-1, and a second shunt resonator 508-2. The first shunt resonator 508-1 and a first terminal 702 of the series resonator 506 are connected to a node 704. The second shunt resonator 508-2 and a second terminal 706 of the series resonator 506 are connected to a node 708.

Figure 8:
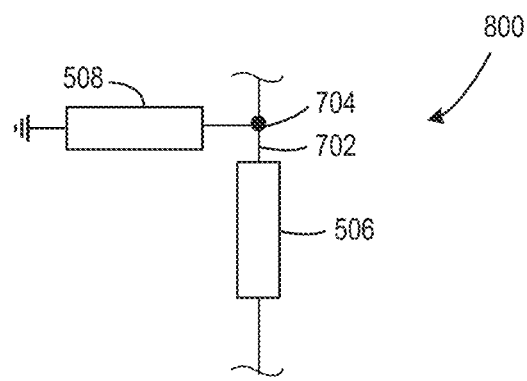
FIG. 8 illustrates a second alternate implementation for each of the passband signal paths and the stopband signal paths shown in FIG. 4-FIG. 6 in accordance with embodiments of the disclosure.

FIG. 8 illustrates a second alternate implementation 800 for each of the passband signal paths and the stopband signal paths shown in FIG. 4-FIG. 6 in accordance with embodiments of the disclosure. The second alternate implementation 800 may be used in the bandpass filter 412 in the passband signal path 402 of FIG. 4. Additionally or alternatively, the second alternate implementation 800 can be used in the first bandstop filter 414 in the first stopband signal path 408-1 and/or in the first bandstop filter 418 in the second stopband signal path 408-2 of FIG. 4. The second alternate implementation 800 may be used in the passband signal path 502 of FIG. 5 and/or in the passband signal path 606 in FIG. 6. Additionally or alternatively, the second alternate implementation 800 can be used in the first stopband signal path 504-1 and/or in the second stopband signal path 504-2 in FIG. 5 and/or in the first stopband signal path 608-1 and/or in the second stopband signal path 608-2 in FIG. 6.

The second alternate implementation 800 includes, at a minimum, a series resonator 506 and a shunt resonator 508. The shunt resonator 508 is connected to the node 704, where the node 704 is connected to the first terminal 702 of the series resonator 506.

Figure 9:
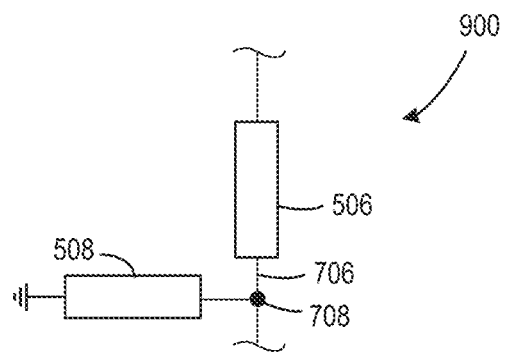
FIG. 9 illustrates a third alternate implementation for each of the passband signal paths and the stopband signal paths shown in FIG. 4-FIG. 6 in accordance with embodiments of the disclosure.

FIG. 9 illustrates a third alternate implementation 900 for each of the passband signal paths and the stopband signal paths shown in FIG. 4-FIG. 6 in accordance with embodiments of the disclosure. The second alternate implementation 800 may be used in the bandpass filter 412 in the passband signal path 402 of FIG. 4. Additionally or alternatively, the second alternate implementation 800 can be used in the first bandstop filter 414 in the first stopband signal path 408-1 and/or in the first bandstop filter 418 in the second stopband signal path 408-2 of FIG. 4. The second alternate implementation 800 may be used in the passband signal path 502 of FIG. 5 and/or in the passband signal path 606 in FIG. 6. Additionally or alternatively, the second alternate implementation 800 can be used in the first stopband signal path 504-1 and/or in the second stopband signal path 504-2 in FIG. 5 and/or in the first stopband signal path 608-1 and/or in the second stopband signal path 608-2 in FIG. 6.

The third alternate implementation 900 includes, at a minimum, a series resonator 506 and a shunt resonator 508. The shunt resonator 506 is connected to the node 708, where the node 708 is connected to the second terminal 706 of the series resonator 506.

Other embodiments can include combinations of the first alternate implementation 700, the second alternate implementation 800, and/or the third alternate implementation 900. In a non-limiting nonexclusive example, two second alternate implementations 800 may be connected together in a signal path. In certain embodiments, two first alternate implementations 700 can be connected together in a signal path. Additionally, in certain embodiments, the construction of the passband signal path may differ from the construction of the stopband signal paths. For example, the passband signal path and the stopband signal paths can all be slightly different in terms of number and/or type of acoustic resonators, and/or the number and/or the type of the impedance matching components.

In certain embodiments, the first stopband signal path or the second stopband signal path in at least one of the embodiments shown in FIGS. 4-6 may be omitted when reduced reflections are not needed on both sides of the bandpass filter (e.g., at the first terminal 404 or the second terminal 406). For example, in FIG. 4, the first stopband signal path 408-1 can be omitted when reduced reflections are not needed at the first terminal. Omitting one of the stopband signal paths may reduce the cost of fabricating the reflectionless acoustic filter and/or reduce the size of the reflectionless acoustic filter.

Figure 10:
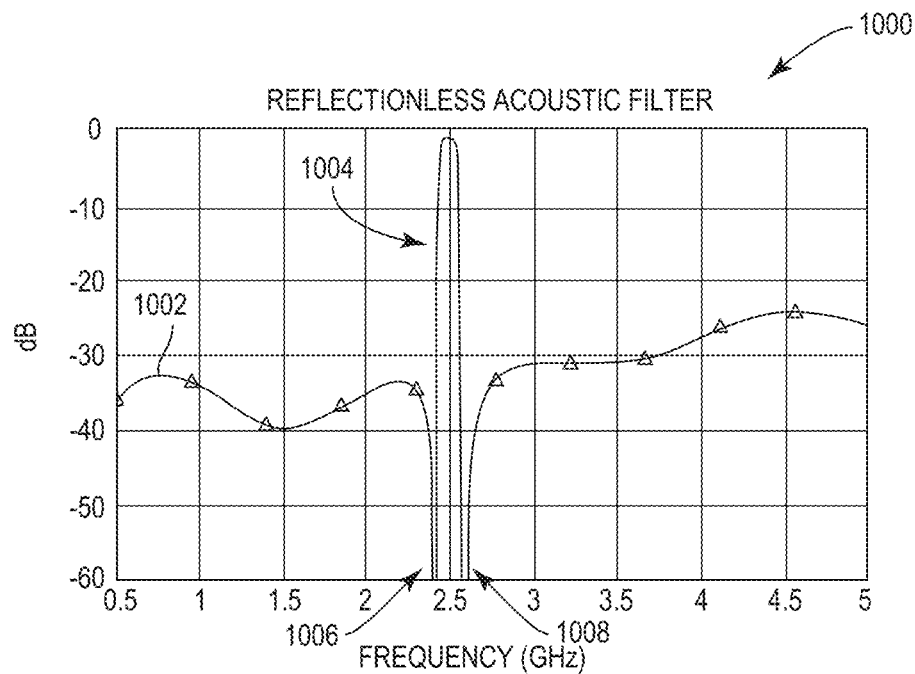
FIG. 10 illustrates a graph that includes an example plot of a filter response for a reflectionless acoustic filter in accordance with embodiments of the disclosure.

FIG. 10 illustrates a graph 1000 that includes an example plot 1002 of a filter response for a reflectionless acoustic filter in accordance with embodiments of the disclosure. The vertical axis represents decibels (dB), and the horizontal axis represents frequency in gigahertz (GHz). The passband 1004 is centered approximately at two and a half (2.5) GHz. Additionally, the transition regions 1006, 1008 of the passband 1004 are steep. In other embodiments, the plot for a reflectionless acoustic filter can differ from the plot 1002. The two and a half (2.5) GHz, the shape and/or the frequency of the passband can differ from the plot 1002, and the shape and/or the frequency of the stopband can differ from the plot 1002.

Figure 11:
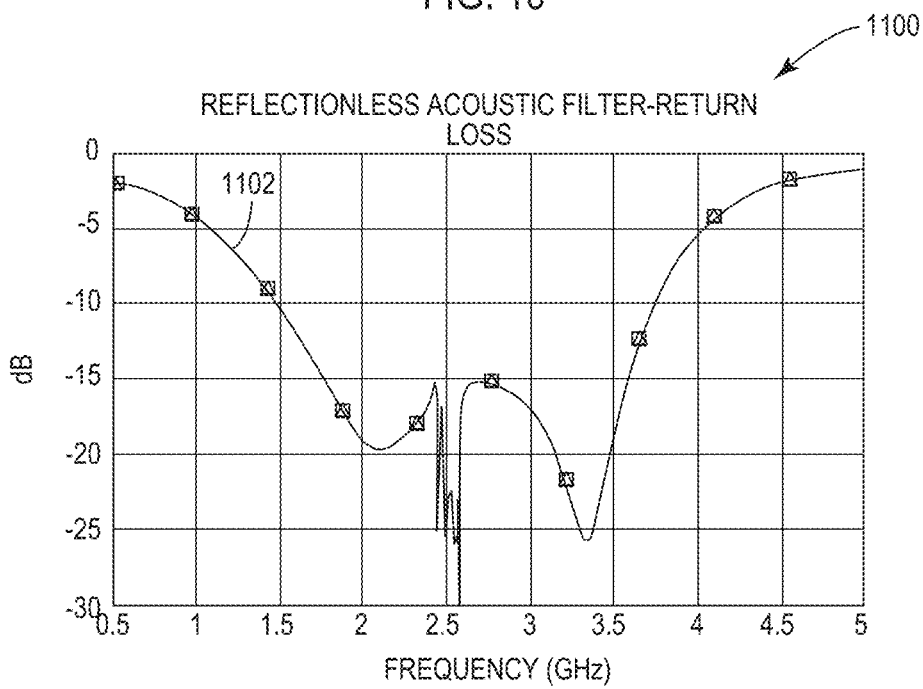
FIG. 11 illustrates a graph that includes an example plot of a return loss for a reflectionless acoustic filter that is associated with the plot shown in FIG. 10 in accordance with embodiments of the disclosure.

FIG. 11 illustrates a graph 1100 that includes an example plot 1102 of a return loss for a reflectionless acoustic filter that is associated with the plot 1002 shown in FIG. 10 in accordance with embodiments of the disclosure. The vertical axis represents dB, and the horizontal axis represents frequency in GHz. The example plot 1102 shows a wide band where the return loss is between minus ten (−10) dB and minus twenty-five (−25) dB. The wide band ranges from approximately one and a half (1.5) GHz and three and a half (3.5) GHz. Thus, at the frequencies associated with the passband 1004 (FIG. 10), as well as at the frequencies near the passband 1004, the reflectionless acoustic filter has very good return loss. The signals that are near the passband 1004 (FIG. 10), but are not in the passband 1004, are absorbed and are not reflected. In other embodiments, the plot of the return loss for a reflectionless acoustic filter can differ from the plot 1102.

FIG. 12 illustrates a graph 1200 that includes an example plot 1202 of a filter response for a non-reflectionless bulk acoustic wave (BAW) filter in accordance with related art. The vertical axis represents dB, and the horizontal axis represents frequency in GHz. Like the example plot 1002 in FIG. 10, the passband 1204 is centered approximately at two and a half (2.5) GHz. One difference between the non-reflectionless BAW filter is in the return loss, as shown in FIG. 13.

FIG. 13 illustrates a graph 1300 that includes an example plot 1302 of a return loss for the non-reflectionless BAW filter that is associated with the filter response shown in FIG. 12 in accordance with related art. The vertical axis represents dB, and the horizontal axis represents frequency in GHz. The example plot 1302 shows a very narrow band where the return loss ranges between zero (0) and approximately minus twenty-five (−25) dB. At all other frequencies (e.g., the out of band or stopband regions 1304), the return loss is approximately seven tenths (0.7) dB. As shown, the stopband return loss in the stopband regions 1304 is around two tenths (0.2) dB to one and a half (1.5) dB. This level of return loss is undesirable because signals that are generated by nonlinear products are reflected back into adjacent components (e.g., amplifiers) that likely output the signals initially. Reflection of the signals potentially further increases the production of nonlinear products.

Other embodiments can tune the return loss of a reflectionless acoustic filter by adjusting the frequencies and/or sizes of the series resonators, the frequencies and or/sizes of the shunt resonators, and/or the resistor values of the termination resistors in a reflectionless acoustic filter. One or more bandpass filters may be tuned to have a different passband response and/or different responses in the stopband regions. Additionally or alternatively, one or more bandstop filters can be tuned to have a different stopband response and/or different responses in the stopband regions.

Figure 14:
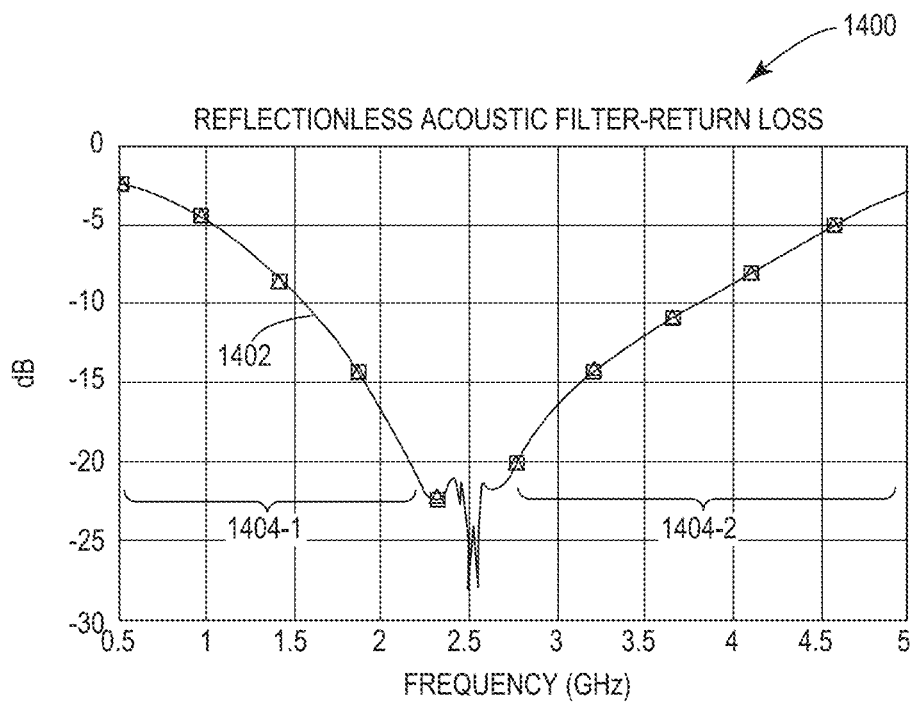
FIG. 14 illustrates a graph that includes an example plot of a first alternate return loss in accordance with embodiments of the disclosure.

FIG. 14 illustrates a graph 1400 that includes an example plot 1402 of an alternate return loss in accordance with embodiments of the disclosure. The vertical axis represents dB, and the horizontal axis represents frequency in GHz. The passband is centered at two and a half (2.5) GHz, although other embodiments are not limited to this implementation.

The plot 1402 differs from the plot 1102 shown in FIG. 11. The return loss represented by the plot 1402 is tuned to have a different shape (e.g., different values) compared to the return loss represented by the plot 1102. The plot 1402 also shows the stopband regions 1404-1, 1404-2 have different responses compared to the stopband regions in FIG. 11. The amounts of the signals that are reflected reduces the closer the frequency is to two and a half (2.5) GHz. In the illustrated graph, the return loss in the stopband region 1404-1 ranges between approximately minus two (−2) dB at one half (0.5) GHz to approximately minus twenty (−20) dB at approximately two (2) GHz. The return loss in the stopband region 1404-2 ranges between approximately minus twenty (−20) dB at approximately three (3) GHz to approximately one half (0.5) GHz at five (5) GHz.

Figure 15:
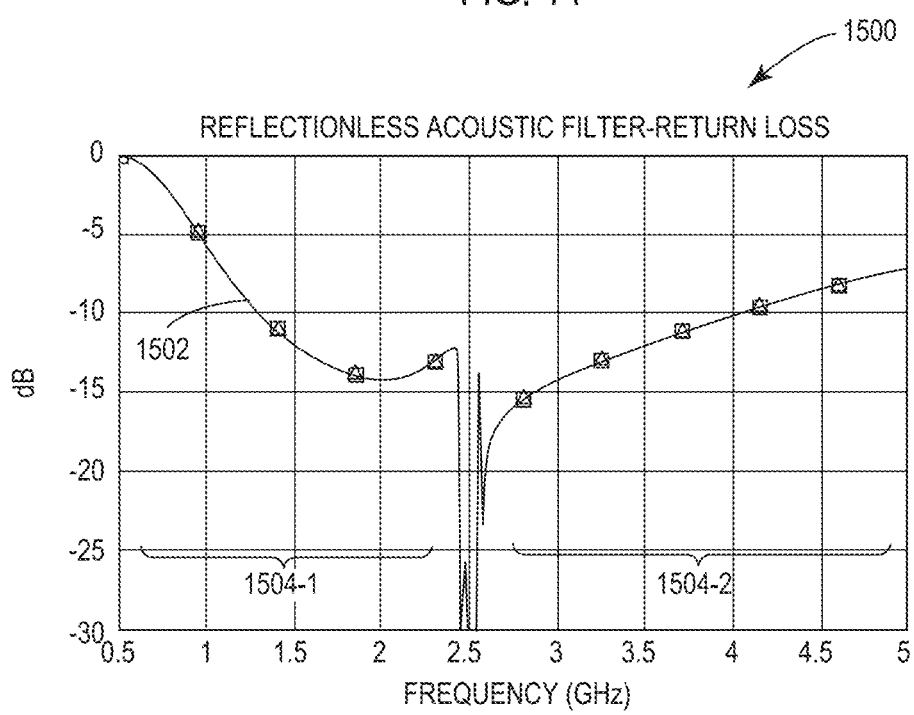
FIG. 15 illustrates a graph that includes an example plot of a second alternate return loss in accordance with embodiments of the disclosure.

FIG. 15 illustrates a graph 1500 that includes an example plot 1502 of a second alternate return loss in accordance with embodiments of the disclosure. The vertical axis represents dB, and the horizontal axis represents frequency in GHz. The passband is centered at two and a half (2.5) GHz, although other embodiments are not limited to this implementation.

The plot 1502 differs from the plot 1102 shown in FIG. 11 and the plot 1402 shown in FIG. 14. The return loss represented by the plot 1502 is tuned to have a different shape (e.g., different values) compared to the return loss represented by the plot 1102 and the plot 1402. The plot 1502 also shows the stopband regions 1504-1, 1504-2 have different responses compared to the stopband regions in FIG. 11 and in FIG. 12. The amounts of the signals that are reflected reduce the closer the frequency is to two and a half (2.5) GHz. In the illustrated graph, the return loss in the stopband region 1504-1 ranges between approximately zero (0) dB at one half (0.5) GHz to approximately minus fourteen (−14) dB at approximately two (2) GHz. The return loss in the stopband region 1504-2 ranges between approximately minus fourteen (−14) dB at approximately three (3) GHz to approximately minus seven (−7) dB at five (5) GHz.

Generally, reflectionless acoustic filters disclosed herein may have a return loss as shown in FIG. 11, FIG. 12, FIG. 15, or some variations thereof, and will not have the return loss as shown in FIG. 13. Thus, embodiments disclosed herein improve the return loss in reflectionless acoustic filters. As described earlier, the return loss can be tuned to have any shape, any passband, and any stopband(s) (e.g., have any values) across a frequency range.

In certain embodiments, it may be desirable to not have good return loss at particular harmonic frequencies (e.g., radio frequencies used with a power amplifier). It may be desirable to have decreased return loss down to DC signals (but still improved return loss compared to the return losses associated with prior art filters such as the filters in FIGS. 1-3). In some instances, it can be desirable to have the DC signals not pass through some components when, for example, biasing an amplifier or a transistor. In other instances, it may be desirable to not have the reflectionless acoustic filter look like fifty (50) ohms to DC. It may be good to have fifty (50) ohms for frequencies a little above DC and around the passband in use. The embodiments disclosed herein provide improvements to Morgan (e.g., paragraph [0031] and FIG. 1).

Figure 16:
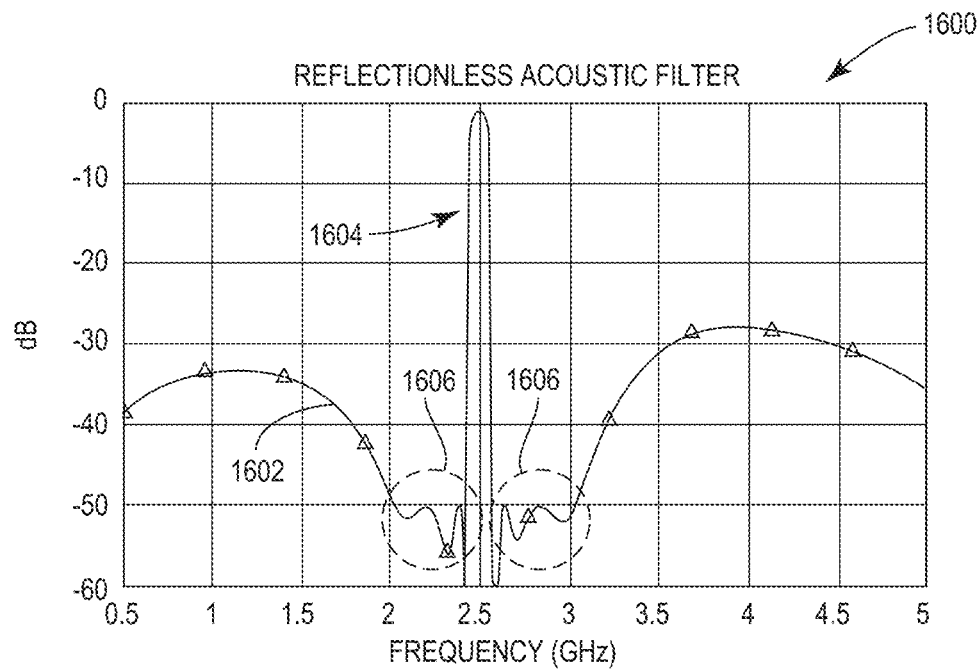
FIG. 16 illustrates a graph that includes an example plot of a filter response in a reflectionless acoustic filter in which the first termination resistor and the second termination resistor shown in FIG. 4-FIG. 6 are omitted in accordance with embodiments of the disclosure.

FIG. 16 illustrates a graph 1600 that includes an example plot 1602 of a filter response in a reflectionless acoustic filter in which the first termination resistor 416 and/or the second termination resistor 420 shown in FIG. 4-FIG. 6 are omitted (resulting in a short to ground) or increased to a very large value resistor to ground/left open in accordance with embodiments of the disclosure. The vertical axis represents dB, and the horizontal axis represents frequency in GHz.

The passband 1604 is centered at two and a half (2.5) GHz, although other embodiments are not limited to this implementation.

The example plot 1602 depicts smaller additional nulls in the dashed circles 1606 above and below the passband 1604. The additional nulls create stopband improvements near the passband 1604. In other embodiments, the plot for a reflectionless acoustic filter can differ from the plot 1602. The two a half (2.5) GHz, the shape and/or the frequency of the passband can differ from the plot 1602, and the shape and/or the frequency of the stopband can differ from the plot 1602.

Figure 17:
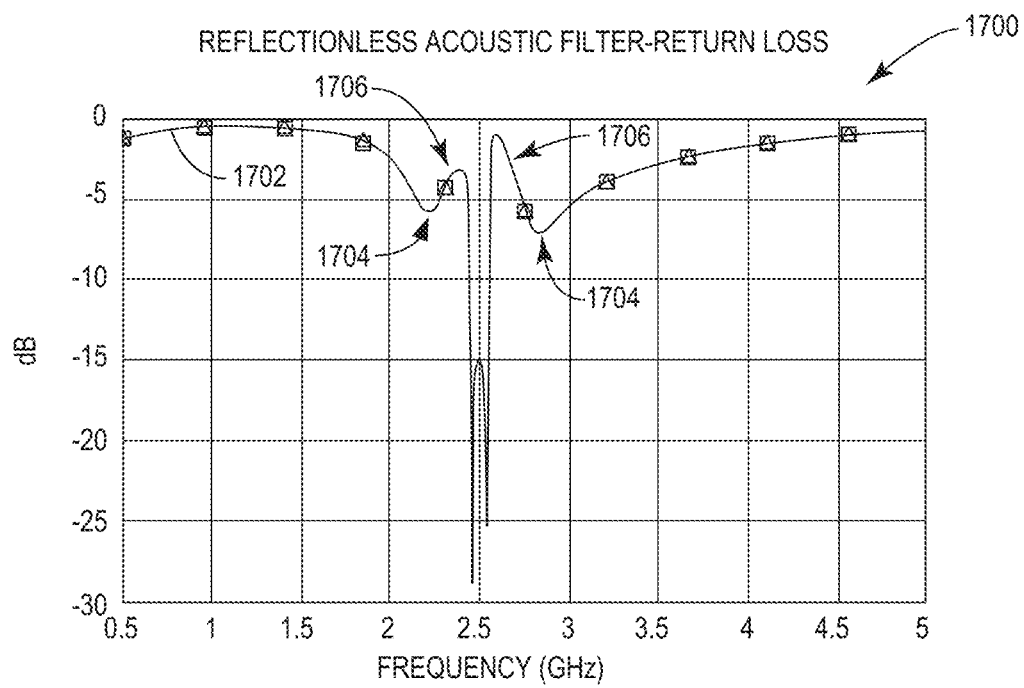
FIG. 17 illustrates a graph that includes an example plot of a return loss in the reflectionless acoustic filter that is associated with the filter response shown in FIG. 16 in accordance with embodiments of the disclosure.

FIG. 17 illustrates a graph 1700 that includes an example plot 1702 of a return loss in the reflectionless acoustic filter that is associated with the filter response shown in FIG. 16 in accordance with embodiments of the disclosure. The vertical axis represents dB, and the horizontal axis represents frequency in GHz. Compared to the plot 1102 in FIG. 11, the example plot 1702 shows a narrower band where the return loss is between approximately minus two (−2) dB and approximately minus fifteen (−15) dB. Thus, at the frequencies associated with the passband 1604 (FIG. 16), the reflectionless acoustic filter has very good return loss. However, in some embodiments, the return loss just outside of the passband is higher (e.g., see 1704) due at least in part to the omission of the first termination resistor 416 and the second termination resistor 420 (FIG. 4-FIG. 6). In other embodiments, the plot of the return loss for a reflectionless acoustic filter can differ from the plot 1702.

Figure 18:
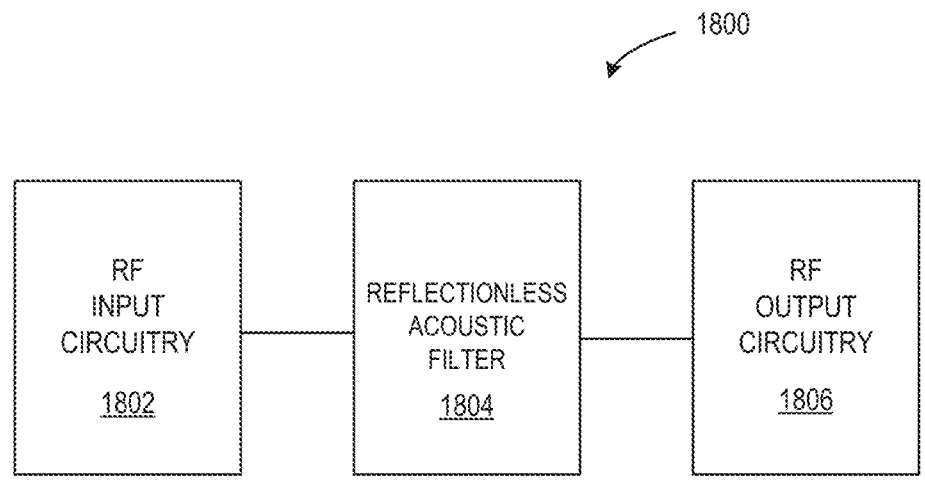
FIG. 18 illustrates a block diagram of an example system that may include one or more reflectionless acoustic filters in accordance with embodiments of the disclosure.

FIG. 18 illustrates a block diagram of an example system 1800 that may include one or more reflectionless acoustic filters in accordance with embodiments of the disclosure. Radio frequency (RF) input circuitry 1802 is connected to one or more reflectionless acoustic filters (collectively represented by the reflectionless acoustic filter 1804). Example RF input circuitry 1802 includes, but is not limited to, one or more transceivers, one or more couplers, and/or one or more power amplifiers. The reflectionless acoustic filter 1804 is implemented as disclosed herein.

The reflectionless acoustic filter 1804 is connected to RF output circuitry 1806. Example RF output circuitry 1806 includes, but is not limited to, an antenna or an antenna array. In some embodiments, the system 1800 is included in a cellular phone and/or a base station. In a non-limiting nonexclusive example, the cellular phone and/or the base station are configured to operate in a fifth generation (5G) mobile network.

Figure 19:
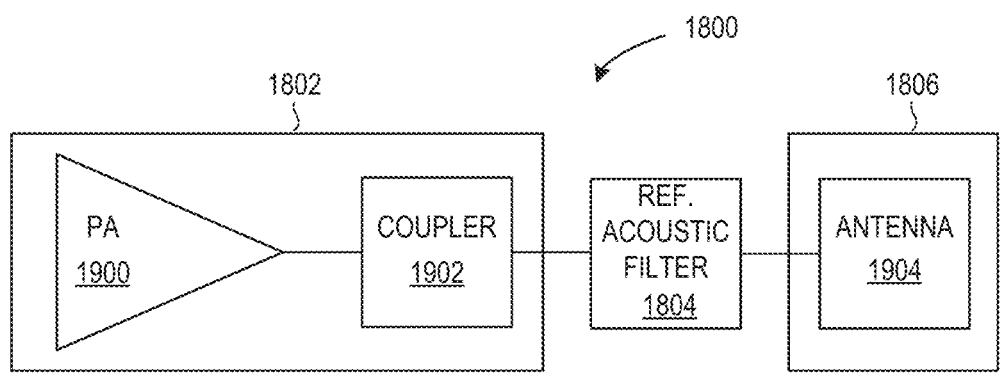
FIG. 19 illustrates an example implementation of the example system shown in FIG. 18 in accordance with embodiments of the disclosure.

FIG. 19 illustrates an example implementation of the example system 1800 shown in FIG. 18 in accordance with embodiments of the disclosure. The system 1800 includes a power amplifier (PA) circuit 1900 connected to a coupler circuit 1902. The PA circuit 1900 and the coupler circuit 1902 are included in the RF input circuitry 1802.

An output of the coupler circuit 1902 is connected to the reflectionless acoustic filter 1804. An output of the reflectionless acoustic filter 1804 is connected to one or more antennas (collectively referred to as an antenna 1904). The antenna 1904 is included in the RF output circuitry 1806. As described earlier, the reflectionless acoustic filter 1804 can be tuned to have a desired return loss. The tuning can be based at least in part on the device that includes the system 1800 and the frequency range used in the operation of the device.

Figure 20:
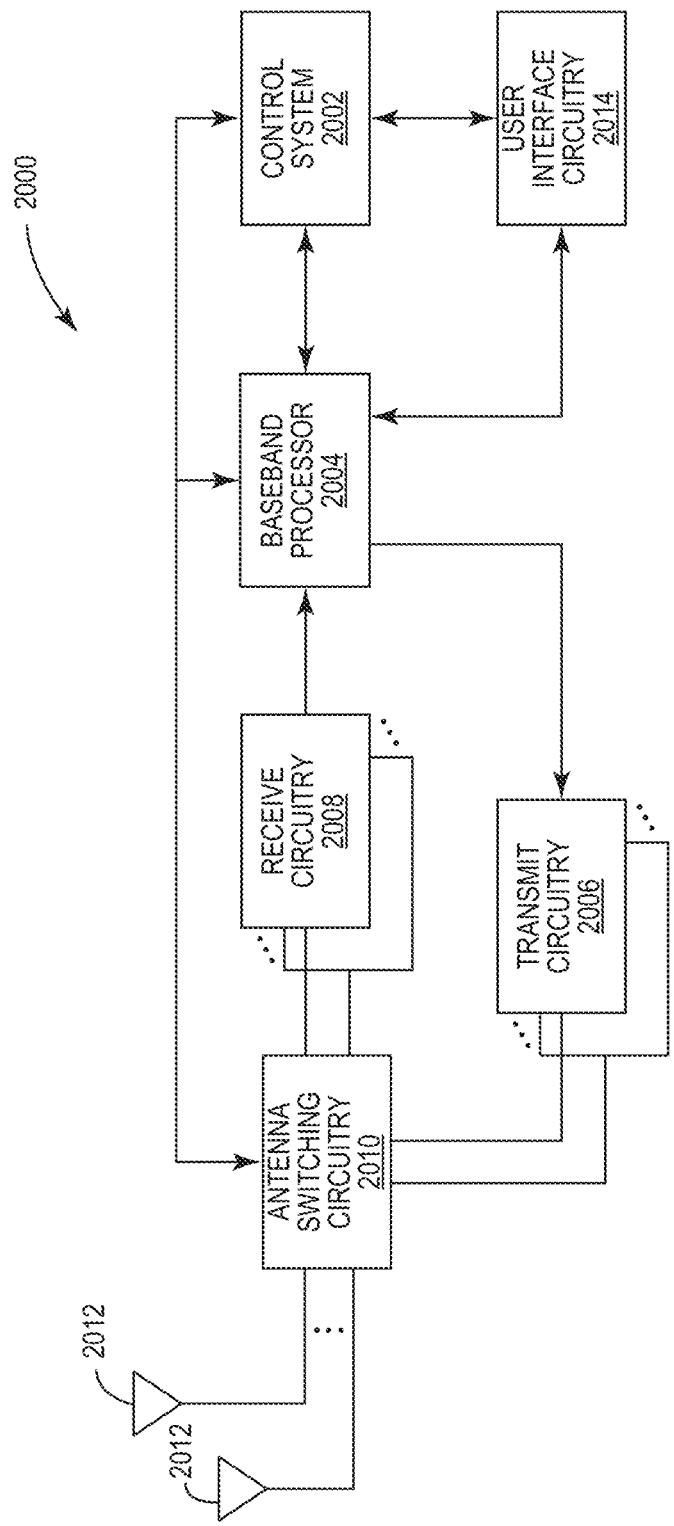
FIG. 20 illustrates an example block diagram of a slave device according to embodiments of the disclosure.

FIG. 20 illustrates example user elements 1900 that can include one or more reflectionless acoustic filters in accordance with embodiments of the disclosure. The concepts described above may be implemented in various types of user elements, such as mobile terminals, smart watches, tablets, computers, navigation devices, access points, and like wireless communication devices that support wireless communications, such as cellular, wireless local area network (WLAN), Bluetooth, and near field communications. The illustrated user elements 1900 will generally include a control system 1902, a baseband processor 1904, transmit circuitry 1906, receive circuitry 1908, antenna switching circuitry 1910, multiple antennas 1912, and user interface circuitry 1914. In a non-limiting example, the control system 1902 can be a field-programmable gate array (FPGA) or an application-specific integrated circuit (ASIC), as an example. In this regard, the control system 1902 can include at least a microprocessor(s), an embedded memory circuit(s), and a communication bus interface(s). The receive circuitry 1908 receives radio frequency signals via the antennas 1912 and through the antenna switching circuitry 1910 from one or more base stations. A low noise amplifier and a filter of the receive circuitry 1908 cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 1904 processes the digitized received signal to extract the information or data bits conveyed in the received signal. This processing typically comprises demodulation, decoding, and error correction operations, as will be discussed on greater detail below. The baseband processor 1904 is generally implemented in one or more digital signal processors (DSPs) and application specific integrated circuits (ASICs).

For transmission, the baseband processor 1904 receives digitized data, which may represent voice, data, or control information, from the control system 1902, which it encodes for transmission. The encoded data is output to the transmit circuitry 1906, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission and deliver the modulated carrier signal to the multiple antennas 1912 through the antenna switching circuitry 1910. The multiple antennas 1912 and the replicated transmit and receive circuitries 1906, 1908 may provide spatial diversity. Modulation and processing details will be understood by those skilled in the art.

FIG. 19 depicts a non-limiting nonexclusive example of user elements that can incorporate embodiments of the disclosure. Embodiments of one or more reflectionless acoustic filters can be included in other types of user elements, circuits, systems, and devices. For example, one or more reflectionless acoustic filters can be used in analog architectures.

An embodiment of a reflectionless acoustic filter provides an acoustic bandpass filter that has acoustic bandstop filters multiplexed to the input terminal and the output terminal. The acoustic bandstop filters are terminated into a load, which dramatically improves the stopband return loss of the reflectionless acoustic filter.

Another embodiment provides an acoustic bandstop filter that has acoustic bandpass filters multiplexed to the input terminal and/or the output terminal. The acoustic bandpass filters are terminated into a load, which dramatically improves the stopband return loss of the filter.

Embodiments of the reflectionless acoustic filters may be implemented in a monolithic construction to aid in tracking resonator temperatures and/or resonator frequencies. Other than any external matching components and external termination resistors, the monolithic construction allows fabrication processes that are similar to traditional acoustic filters fabrication process to be used.

The acoustic resonators may be placed in series or in parallel improve power handling and/or loss in a reflectionless acoustic filter. The filter sections (e.g., the bandpass filter and/or the bandstop filter) may be placed in parallel improve power handling and/or loss in a reflectionless acoustic filter.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An acoustic filter, comprising:
 a bandpass filter in a passband signal path, the passband signal path connected between a first terminal and a second terminal, wherein the bandpass filter comprises at least one series resonator connected to at least one shunt resonator;
 a first bandstop filter in a first stopband signal path, the first stopband signal path connected at the first terminal, wherein the first bandstop filter comprises at least one series resonator connected to at least one shunt resonator;
 a second bandstop filter in a second stopband signal path, the second stopband signal path connected at the second terminal, wherein the second bandstop filter comprises at least one series resonator connected to at least one shunt resonator;
 wherein a frequency of the at least one series resonator of the bandpass filter is used as a frequency of the at least one shunt resonator of the first stopband filter and as a frequency of the at least one shunt resonator of the second bandstop filter; and
 wherein a frequency of the at least one shunt resonator of the bandpass filter is used as a frequency of the at least one series resonator of the first stopband filter and as a frequency of the at least one series resonator of the second bandstop filter.

2. The acoustic filter of claim 1, further comprising:
 a first termination resistor connected between the first bandstop filter and a reference terminal; and
 a second termination resistor connected between the second bandstop filter and the reference terminal.

3. The acoustic filter of claim 1, wherein the first terminal is an input terminal and the second terminal is an output terminal.

4. An acoustic filter, comprising:
 at least one bandpass filter in a passband signal path, the passband signal path connected between a first terminal and a second terminal, wherein the at least one bandpass filter comprises at least one series resonator connected to at least one shunt resonator;
 at least one first bandstop filter in a first stopband signal path, the first stopband signal path connected at the first terminal, wherein the at least one the first bandstop filter comprises at least one series resonator connected to at least one shunt resonator; and at least one second bandstop filter in a second stopband signal path, the second stopband signal path connected at the second terminal, wherein the at least one second bandstop filter comprises at least one series resonator connected to at least one shunt resonator;

wherein a frequency of the at least one series resonator of the at least one bandpass filter is used as a frequency of the at least one shunt resonator of the at least one first stopband filter and as a frequency of the at least one shunt resonator of the at least one second bandstop filter; and wherein a frequency of the at least one shunt resonator of the at least one bandpass filter is used as a frequency of the at least one series resonator of the at least one first stopband filter and as a frequency of the at least one series resonator of the at least one second bandstop filter.

5. The acoustic filter of claim 4, further comprising:
a first termination resistor connected between the first bandstop filter and a reference terminal; and
a second termination resistor connected between the second bandstop filter and the reference terminal.

6. The acoustic filter of claim 4, wherein the first terminal is an input terminal and the second terminal is an output terminal.

7. An acoustic filter, comprising:
a bandpass filter connected between a first terminal and a second terminal, the bandpass filter comprising a first acoustic resonator and a second acoustic resonator, the first acoustic resonator connected in shunt to the second acoustic resonator;
a first bandstop filter connected at the first terminal, the first bandstop filter comprising a third acoustic resonator and a fourth acoustic resonator, the third acoustic resonator connected in shunt to the fourth acoustic resonator; and
a second bandstop filter connected at the second terminal, the second bandstop filter comprising a fifth acoustic resonator and a sixth acoustic resonator, the fifth acoustic resonator connected in shunt to the sixth acoustic resonator.

8. The acoustic filter of claim 7, further comprising:
a first termination resistor connected between the third acoustic resonator and a reference terminal; and
a second termination resistor connected between the fifth acoustic resonator and the reference terminal.

9. The acoustic filter of claim 7, wherein each of the first acoustic resonator, the second acoustic resonator, the third acoustic resonator, the fourth acoustic resonator, the fifth acoustic resonator, and the sixth acoustic resonator comprises a bulk acoustic resonator.

10. The acoustic filter of claim 7, wherein each of the first acoustic resonator, the second acoustic resonator, the third acoustic resonator, the fourth acoustic resonator, the fifth acoustic resonator, and the sixth acoustic resonator comprises a surface wave acoustic wave resonator.

11. The acoustic filter of claim 7, further comprising one or more impedance matching components.

12. The acoustic filter of claim 11, wherein the one or more impedance matching components each comprise an inductor, a capacitor, a resistor, or a transformer.

13. The acoustic filter of claim 7, wherein the first terminal is an input terminal and the second terminal is an output terminal.

14. The acoustic filter of claim 7, wherein:
the bandpass filter further comprises at least one additional acoustic resonator;
the first bandstop filter further comprises at least one additional acoustic resonator; or
the second bandstop filter further comprises at least one additional acoustic resonator.

15. An acoustic filter, comprising:
a bandpass filter connected between a first terminal and a second terminal, the bandpass filter comprising a first acoustic resonator and a second acoustic resonator, the second acoustic resonator connected between a first terminal of the first acoustic resonator and a reference terminal;
a first bandstop filter connected at the first terminal, the first bandstop filter comprising a third acoustic resonator and a fourth acoustic resonator, the fourth acoustic resonator connected between a second terminal of the third acoustic resonator and the reference terminal; and
a second bandstop filter connected at the second terminal, the second bandstop filter comprising a fifth acoustic resonator and a sixth acoustic resonator, the sixth acoustic resonator connected between a third terminal of the fifth acoustic resonator and the reference terminal.

16. The acoustic filter of claim 15, further comprising:
a first termination resistor connected between a fourth terminal of the third acoustic resonator and the reference terminal; and
a second termination resistor connected between a fifth terminal of the fifth acoustic resonator and the reference terminal.

17. The acoustic filter of claim 15, wherein each of the first acoustic resonator, the second acoustic resonator, the third acoustic resonator, the fourth acoustic resonator, the fifth acoustic resonator, and the sixth acoustic resonator comprises a bulk acoustic resonator.

18. The acoustic filter of claim 15, wherein each of the first acoustic resonator, the second acoustic resonator, the third acoustic resonator, the fourth acoustic resonator, the fifth acoustic resonator, and the sixth acoustic resonator comprises a surface acoustic wave resonator.

19. The acoustic filter of claim 15, further comprising one or more impedance matching components.

20. The acoustic filter of claim 19, wherein the one or more impedance matching components each comprise an inductor, a capacitor, a resistor, or a transformer.

21. The acoustic filter of claim 15, wherein the first terminal is an input terminal and the second terminal is an output terminal.

22. An acoustic filter, comprising:
a passband signal path connected between a first terminal and a second terminal, the passband signal path comprising a first acoustic resonator and a second acoustic resonator, the second acoustic resonator connected between a first terminal of the first acoustic resonator and a reference terminal;
a first stopband signal path connected at the first terminal, the first stopband signal path comprising a third acoustic resonator and a fourth acoustic resonator, the fourth acoustic resonator connected between a second terminal of the third acoustic resonator and the reference terminal; and
a second stopband signal path connected at the second terminal, the second stopband signal path comprising a fifth acoustic resonator and a sixth acoustic resonator, the sixth acoustic resonator connected between a third terminal of the fifth acoustic resonator and the reference terminal.

23. An acoustic filter, comprising:
- a passband signal path connected between a first terminal and a second terminal, the passband signal path comprising a bandpass filter, wherein the bandpass filter comprises at least one series resonator connected to at least one shunt resonator;
- a first stopband signal path connected at the first terminal, the first stopband signal path comprising a first bandstop filter, wherein the first bandstop filter comprises at least one series resonator connected to at least one shunt resonator;
- a second stopband signal path connected at the second terminal, the second stopband signal path comprising a second bandstop filter, wherein the second bandstop filter comprises at least one series resonator connected to at least one shunt resonator;
- a first termination resistor connected between the first bandstop filter and a reference terminal;
- a second termination resistor connected between the second bandstop filter and the reference terminal;
- wherein a frequency of the at least one series resonator of the bandpass filter is used as a frequency of the at least one shunt resonator of the first stopband filter and as a frequency of the at least one shunt resonator of the second bandstop filter; and
- wherein a frequency of the at least one shunt resonator of the bandpass filter is used as a frequency of the at least one series resonator of the first stopband filter and as a frequency of the at least one series resonator of the second bandstop filter.

24. The acoustic filter of claim 23, wherein the first terminal is an input terminal and the second terminal is an output terminal.

25. The acoustic filter of claim 23, wherein the reference terminal is ground.

* * * * *